United States Patent
Lu

(10) Patent No.: US 8,248,120 B1
(45) Date of Patent: *Aug. 21, 2012

(54) SYSTEMS, METHODS AND CIRCUITRY RELATING TO FREQUENCY DIVIDERS

(75) Inventor: Siu Chuang Lu, San Jose, CA (US)

(73) Assignee: Marvell International Ltd. (BM)

( * ) Notice: Subject to any disclaimer, the term of this patent is extended or adjusted under 35 U.S.C. 154(b) by 1 day.

This patent is subject to a terminal disclaimer.

(21) Appl. No.: 13/099,074

(22) Filed: May 2, 2011

Related U.S. Application Data

(63) Continuation of application No. 12/212,538, filed on Sep. 17, 2008, now Pat. No. 7,936,190.

(60) Provisional application No. 60/972,967, filed on Sep. 17, 2007.

(51) Int. Cl.
 *H03B 19/00* (2006.01)

(52) U.S. Cl. ......... 327/117; 327/102; 327/103; 327/115

(58) Field of Classification Search .................. 327/103, 327/115, 117
See application file for complete search history.

(56) References Cited

U.S. PATENT DOCUMENTS

2006/0038594 A1 2/2006 Copani et al.

*Primary Examiner* — John Poos

(57) ABSTRACT

A frequency divider can include at least one input device receiving an input signal, the at least one input device converting the input signal to a current signal; a driver stage with at least two drivers, the at least two drivers receiving the current signal from the at least one input device; a latch stage with at least two latches receiving output signals from the driver stage, the latch stage amplifying the output signals from the driver stage in proportion to an imbalance on the driver stage; and a feedback loop feeding back latch stage output signals to the driver stage. The driver stage and the latch stage can divide the input signal such that the current signal has a frequency of a multiple of the divided signal, and the frequency divider can also include at least one output device to convert the divided signal to a divided voltage signal.

20 Claims, 9 Drawing Sheets

SYSTEMS, METHODS AND CIRCUITRY RELATING TO FREQUENCY DIVIDERS

CROSS REFERENCE TO RELATED APPLICATIONS

This application is a continuation of U.S. application Ser. No. 12/212,538 (now U.S. Pat. No. 7,936,190), filed Sep. 17, 2008, which claims priority under 35 U.S.C. §119(e) to U.S. Provisional Application No. 60/972,967, filed Sep. 17, 2007. The disclosures of the applications referenced above are incorporated herein by reference.

BACKGROUND

The present disclosure describes systems and techniques relating to electrical circuits.

Frequency dividers are an integral part of phase-lock loop circuits, making them a building block in radio frequency identification circuits (RFIC) and microwave circuits. In some phase-locked loop circuits, an output of a voltage-controlled oscillator (VCO) is divided by a frequency divider to a frequency at which a temperature-compensated crystal oscillator operates. A phase detector compares the divided signal and the temperature-compensated crystal oscillator signal. The voltage-controlled oscillator output frequency can be adjusted in some circuits by using the output phase difference.

In some conventional frequency divider implementations, trade-offs arise concerning the maximum operating frequency, power consumption, number of transistors needed and flexibility. In analog frequency dividers, a conventional range for input signals is 20 GHz to 100 GHz. The range for conventional digital frequency dividers in complementary metal-oxide-semiconductors is below 1 GHz to 10 GHz.

SUMMARY

The present disclosure includes systems and techniques relating to a frequency divider. According to an aspect of the described systems and techniques, an apparatus includes a frequency divider that includes at least one input device receiving an input signal, the at least one input device converting the input signal to a current signal, a driver stage with at least two drivers, the at least two drivers receiving the current signal from the at least one input device, a latch stage with at least two latches receiving output signals from the driver stage, the latch stage amplifying the output signals from the driver stage in proportion to an imbalance on the driver stage, a feedback loop feeding back latch stage output signals to the driver stage, the driver stage and the latch stage dividing the input signal such that the current signal has a frequency of a multiple of the divided signal, and at least one output device to convert the divided signal to a divided voltage signal.

According to another aspect of the described systems and techniques, a method includes converting an input signal to a current signal, transmitting the current signal at least twice in parallel, producing a driven signal, latching the driven signal at least twice in parallel, including amplifying the driven signal in proportion to an imbalance associated with transmitting the driven signal, feeding back an output from the latched driven signal into the parallel transmissions of the current signal, receiving a divided driven signal from the latching at least twice in parallel, the divided driven signal having a frequency being a fraction of the driven signal, and converting the divided driven signal to a divided voltage signal.

The described systems and techniques can be implemented in electronic circuitry, computer hardware, firmware, software, or in combinations of them, such as the structural means disclosed in this specification and structural equivalents thereof. This can include at least one computer-readable medium embodying a program operable to cause one or more data processing apparatus (e.g., a signal processing device including a programmable processor) to perform operations described. Thus, program implementations can be realized from a disclosed method, system, or apparatus, and apparatus implementations can be realized from a disclosed system, computer-readable medium, or method. Similarly, method implementations can be realized from a disclosed system, computer-readable medium, or apparatus, and system implementations can be realized from a disclosed method, computer-readable medium, or apparatus.

For example, the disclosed embodiment(s) below can be implemented in various systems and apparatus, including, but not limited to, a special purpose data processing apparatus (e.g., a wireless access point, a remote environment monitor, a router, a switch, a computer system component, a medium access unit), a mobile data processing apparatus (e.g., a wireless client, a cellular telephone, a personal digital assistant (PDA), a mobile computer, a digital camera), a general purpose data processing apparatus (e.g., a minicomputer, a server, a mainframe, a supercomputer), or combinations of these.

Thus, according to another aspect of the described systems and techniques, a system can include a communications medium access device, and one or more integrated circuits including a frequency divider including at least one input device receiving an input signal, the at least one input device converting the input signal to a current signal, a driver stage with at least two drivers, the at least two drivers receiving the current signal from the at least one input device, a latch stage with at least two latches receiving output signals from the driver stage, the latch stage amplifying the output signals from the driver stage in proportion to an imbalance on the driver stage, a feedback loop feeding back latch stage output signals to the driver stage, the driver stage and the latch stage dividing the input signal such that the current signal has a frequency of a multiple of the divided signal, and at least one output device to convert the divided signal to a divided voltage signal.

The described systems and techniques can result in higher frequency operation and improved locking range for a given power consumption. The transconductance of a clock driver can also be increased to maximize clock energy injected into a common source node to improve locking range and oscillation frequency. The oscillation frequency may also be increased by reducing the latch stage current. In some implementations, the frequency divider can divide signals with an initial frequency above 10 GHz or above 12 GHz. The in-phase/Quadrature (IQ) matching can also be improved using larger driver devices. Likewise, IQ matching may be improved implementing a degenerated latch stage, which may also retain performance levels of alternating current. Power consumption can also be reduced, in some implementations, power consumption can be reduced from approximately 3 mA to approximately 2.75 mA.

Details of one or more implementations are set forth in the accompanying drawings and the description below. Other features, objects and advantages may be apparent from the description and drawings, and from the claims.

DRAWING DESCRIPTIONS

Like reference symbols in the various drawings indicate like elements.

DETAILED DESCRIPTION

The systems and techniques described herein can be implemented as one or more devices, such as one or more integrated circuit (IC) devices, in communication systems (e.g., a wireless communication device, a broadband communication system, or a channel medium access access/control device). For example, the systems and techniques disclosed can be implemented in a wireless local area network (WLAN) transceiver device (e.g., a WLAN chipset) suitable for use in an OFDM MIMO system.

Figure 1:
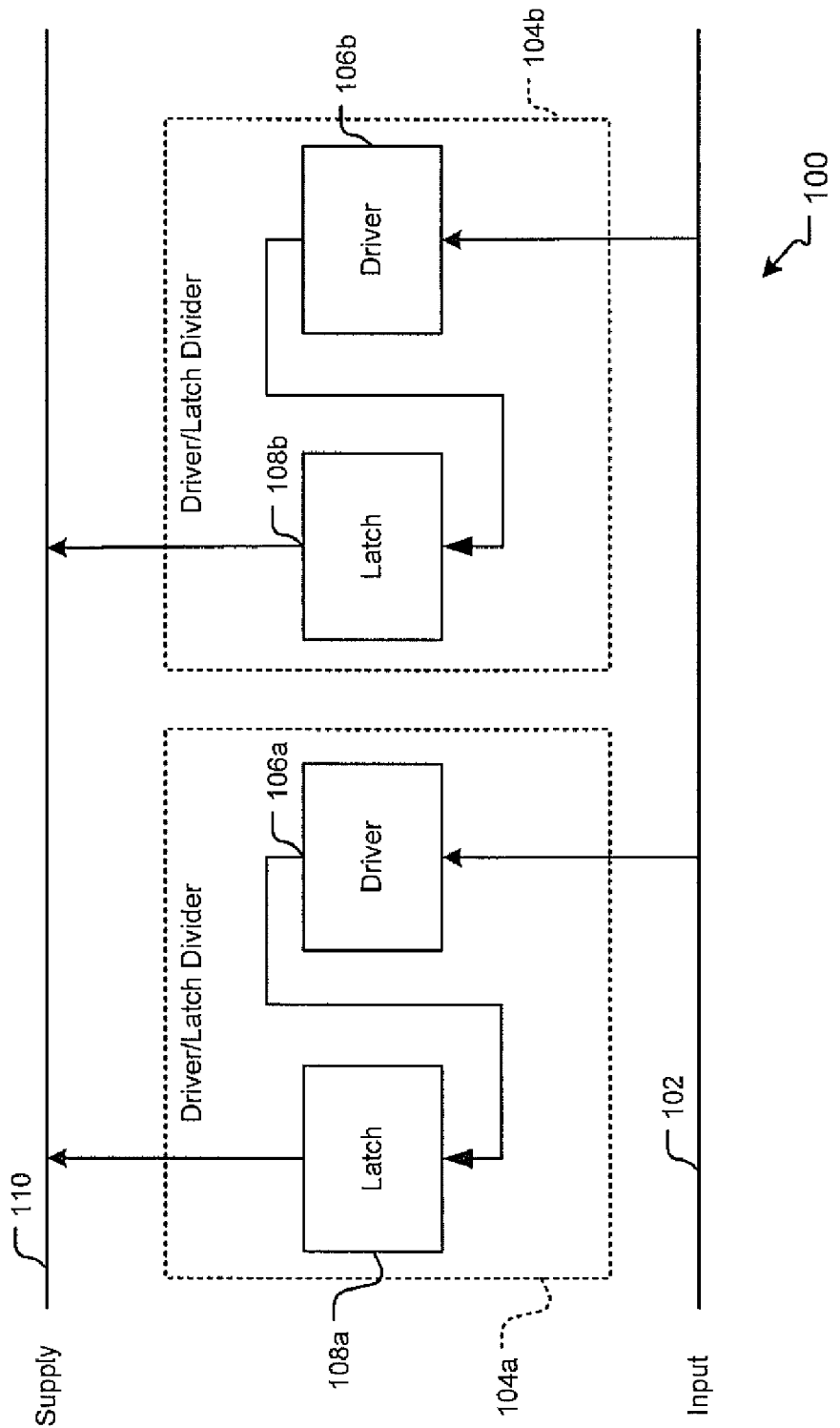
FIG. 1 is a block diagram illustrating a prior art current mode logic divider.

FIG. 1 is a block diagram illustrating a prior art current mode logic (CML) divider 100. The CML divider 100 includes an input signal 102, at least two driver/latch dividers 104a-b, and a supply signal 110. In each driver latch divider 104a-b, there is a driver 106a-b and a latch 108a-b.

Each of the driver/latch dividers 104a-b has the same configuration in the CML divider 100. The driver/latch dividers 104a-b are controlled through a clock signal. In one phase of the clock signal, the input signal 102 is received through the input gate of the drivers 106a-b. Once injected, the signal is stored in the latches 108a-b and latched. Both the latches 108a-b and the drivers 106a-b receive a signal with the same current.

The CML divider 100 generates the supply signal 110 as a sine wave over time. If the input signal 102 increases in amplitude above 10 GHz, there is a likelihood that the signal will fail. At 12 GHz, the signal is very likely to fail. Keeping the latches 108a-b at the same current as the drivers 106a-b can cause a lower oscillation frequency. In this regard, IQ matching for the CML divider 100 may not be ideal.

In the best-case signal ringing (FF corner) and the worst-case signal delay (SS corner), issues can arise. In the FF corner, additional load of a higher frequency cannot typically be driven using traditional CML divider 100 technology. Likewise, the SS corner can show difficulties with signals at frequencies higher than 10 GHz when input into the CML divider 100. Current consumption is often also a concern in such devices.

FIG. 2 shows a block diagram of an example frequency divider 200 in accordance with the present disclosure. The exemplary frequency divider 200 includes input signals 202a-b, input devices 204a-b, a driver stage 206 with two drivers 208a-b, a latch stage 210 with two latches 212a-b, output devices 214a-b, and a supply signal 216. The input signal 202a-b can be transformed to a current signal by the input devices 204a-b and can be transmitted in parallel to the driver stage 206. The driver stage 206 can produce a driven signal, transmitting the driven signal to the latch stage 210.

The latch stage 210 can latch the driven signal at least twice in parallel, including amplifying the driven signal in proportion to an imbalance associated with transmitting the driven signal. The latch stage 210 can feed back an output from the latched driven signal into the parallel transmissions. The divided driven signal can be received from the latch stage 210. In some implementations, the divided driven signal can have a frequency of a fraction of the driven signal. The divided driven signal can be converted to a supply signal 216 using the pair of output devices 214a-b.

In various specific implementations, the frequency of the input signal 202a-b should be within a defined range. For example, the input signal 202a-b may be a voltage with a frequency at or above 10 GHz. In some instances, the input signal 202a-b may have a frequency at or above 12 GHz. The input signal 202a-b may have a frequency approaching or reaching 100 GHz. Once the input signal 202a-b reaches the exemplary frequency divider 200, the input devices may include various devices to transform the input signal 202a-b from a voltage to a current. For example, the devices may include parasitic capacitors and input driving transistors.

In some implementations, the drivers 208a-b in the driver stage 206 can act like a differential pair. Likewise, the latch stage 210 can be set to an "on" position, unlike a CML divider 100. The exemplary frequency divider 200 can be biased differently from the CML divider 100, where the driver stage 206 is clocked and the latch stage 210 is not.

In the latch stage 210, the latches 212a-b can be a cross-coupled pair, as is used in a CML divider 100. If there is a differential signal, however, with a very small imbalance injected on the driver side, the cross-coupled pair can help the latch stage 210 amplify the driven signal to a very large proportion. The latch stage 210 can then feed back the driven latched signal to one of the drivers 206.

In some embodiments, the latch stage 210 may not be clocked. This may increase degeneration considerably to help the current matching of two branches and I/Q mismatch. Resistors may also be added to the input devices 204a-b to increase the common mode noise rejection to help the I/Q mismatch. The output devices 214a-b can also implement resistors to create voltage from the output of the latch stage 210 and to determine the IC corner, or speed of divider.

The signal input at the latch stage 210 may have a different amperage than the driver stage 206. In some implementations, the ratio between latch stage 210 and driver stage 206 may be 1:3. Although in some implementations, the total current in the CML divider 100 is not different than the exemplary frequency divider 200; the more current the driver stage 206 is given, the faster it may switch. With faster switching, a larger amplitude may be reached, assisting in maintaining the integrity of the signal. The exemplary frequency divider 200 may include input devices 202a-b that are larger and faster to provide switching at the driver stage 206 with more current. The clock signal may only be input on the driver stage 206 if the clock signal is unnecessary for the function of the latch stage 210. For example, if the latch stage is always set to latch, then a clock signal may not be necessary.

Figure 2A:
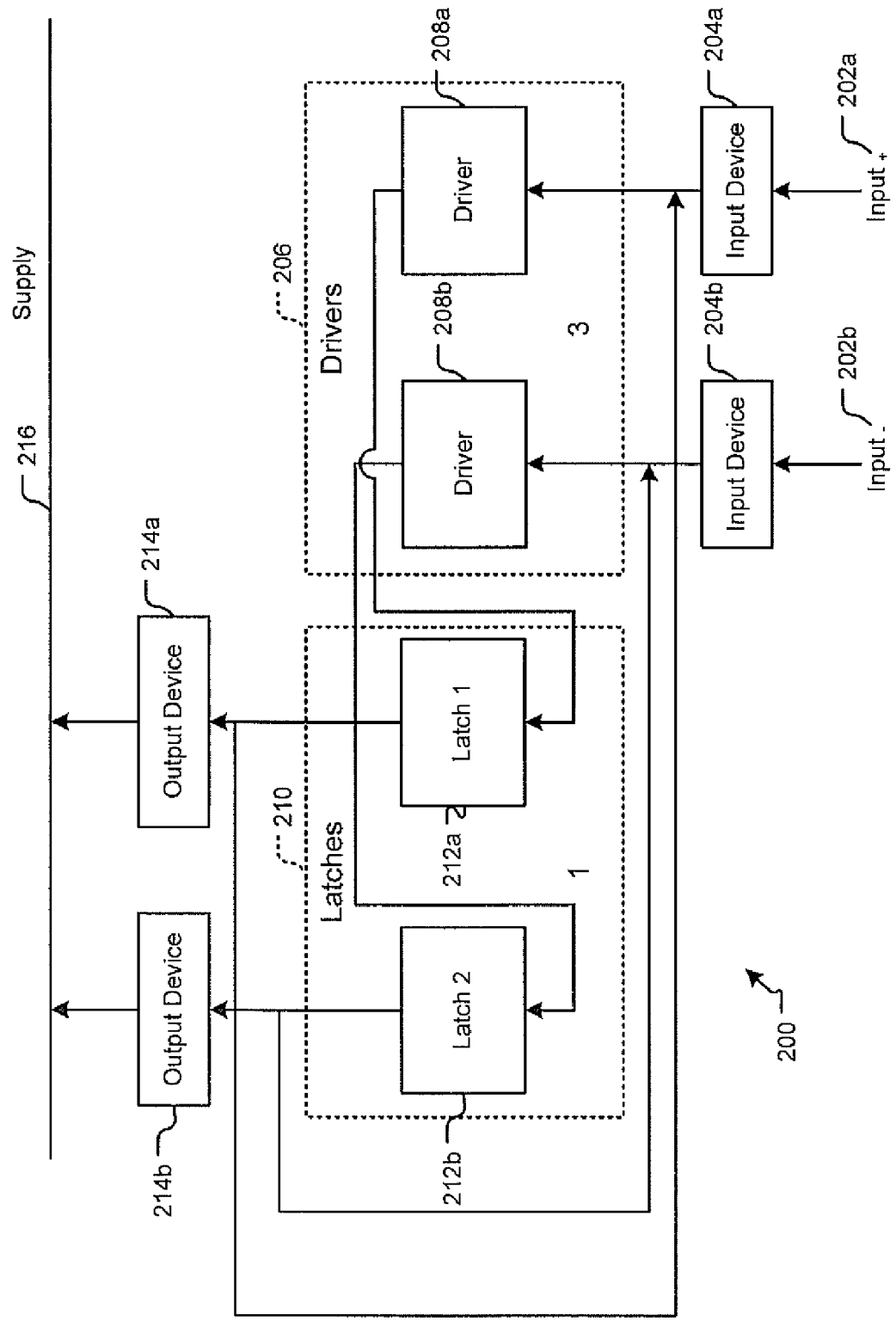
FIG. 2A shows a block diagram of an example frequency divider in accordance with the present disclosure.
Figure 2B:
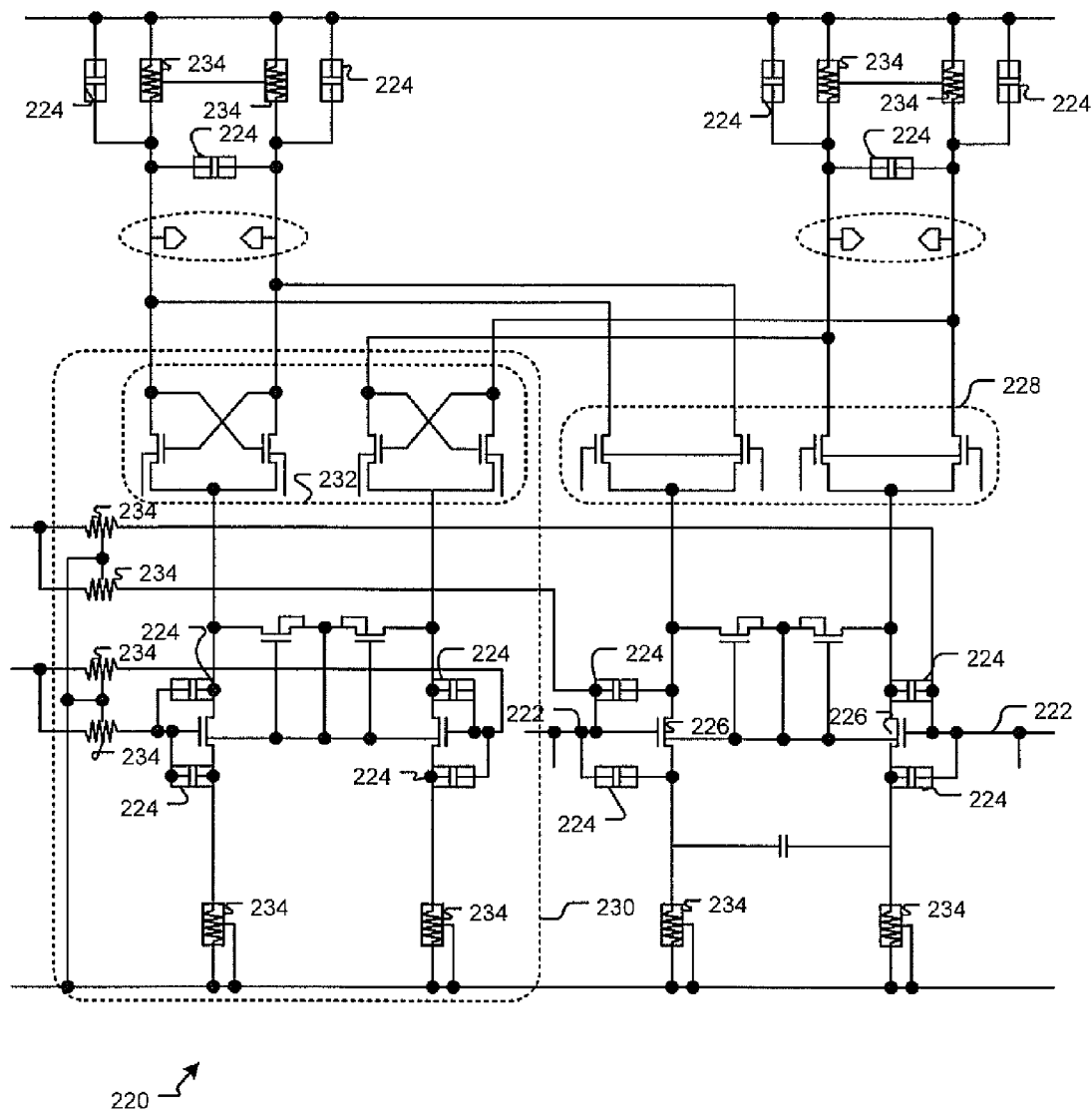
FIG. 2B shows a circuit diagram of another example frequency divider in accordance with the present disclosure.

FIG. 2B shows a circuit diagram of another example frequency divider 220 in accordance with the present disclosure. The exemplary frequency divider 220 includes input points 222, parasitic capacitors 224, input driving transistors 226, a driver pair 228, a latch stage 230, a cross-coupled pair 232, and resistors 234. In some implementations, the latch stage 230 can remain on through the frequency division. Likewise, the latch stage 230 can require a reduced current compared to current for the driver pair 228. For example, the current ratio between the driver pair 228 and the latch stage 230 can be a 3:1 ratio. In some implementations, a clock can control the driver pair 228. The latch stage 230 may remain unclocked. In some implementations, degeneration can be applied to the latch stage 230 to improve IQ matching.

Likewise, the input driving transistors may be linked to two capacitors. The capacitors may be used, for example, to provide a differential short at high frequencies. This, in turn, may allow the input driving transistors to operate at a high transconductance and speed at selected radio frequencies. The capacitors may also enable the circuit to remain open at low frequencies to improve IQ matching.

Figure 2C:
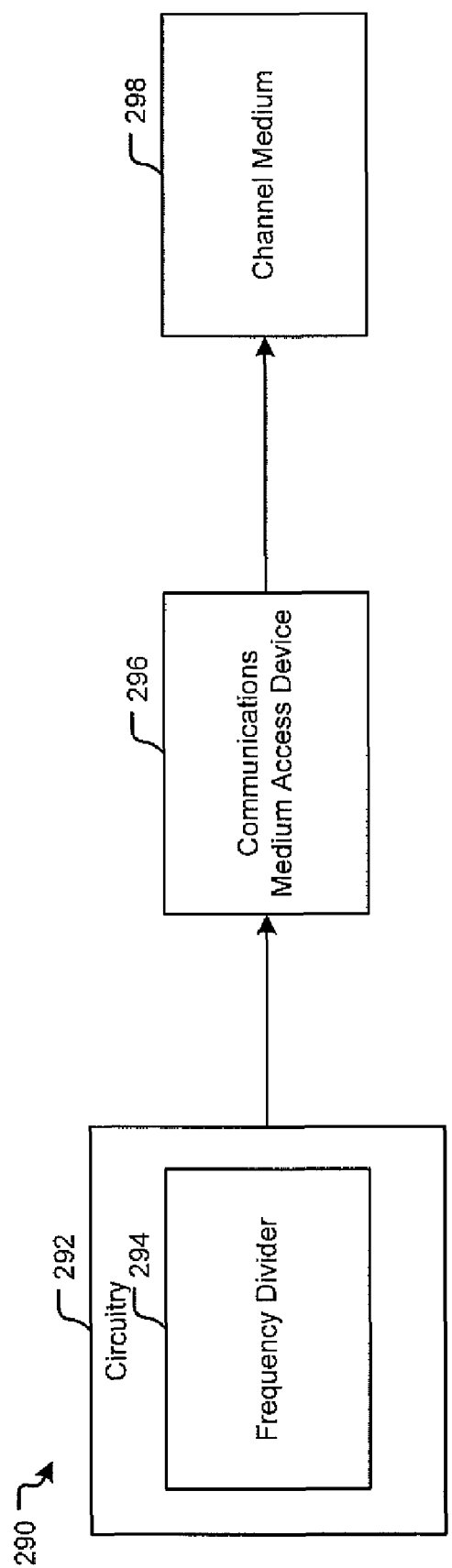
FIG. 2C shows a block diagram an example system in which the frequency dividers of FIGS. 2A-2B can be implemented.

FIG. 2C shows a block diagram an example system 290 in which the frequency dividers of FIGS. 2A-2B can be implemented. The exemplary system 290 includes circuitry 292 that may have a frequency divider 294, a communications medium access device 296, and a channel medium 298. The channel medium 298 can be a wired or wireless channel.

Figure 3:
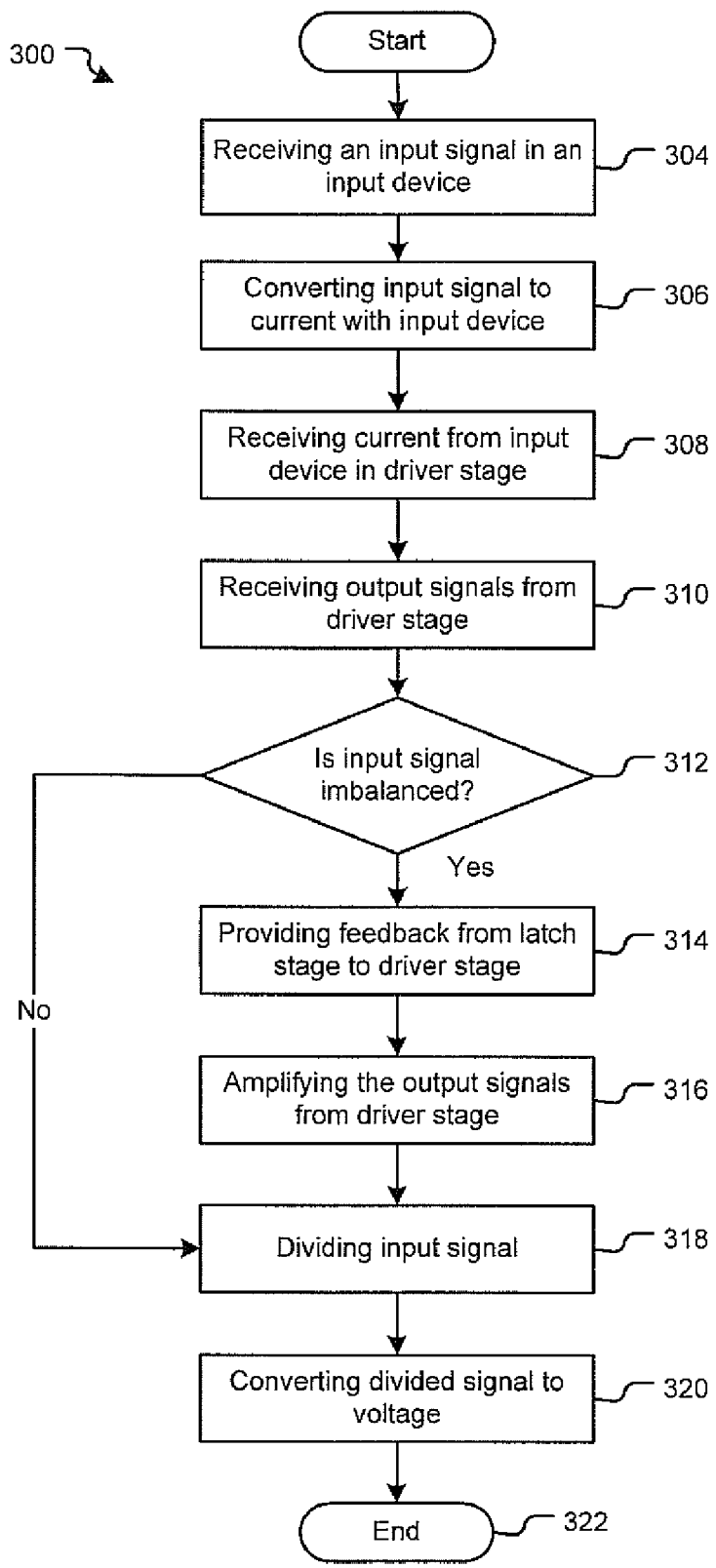
FIG. 3 is a flow chart showing an example process 300 for dividing a frequency signal.

FIG. 3 is a flow chart showing an example process 300 for dividing a frequency signal. For convenience, the process 300 will be described with respect to a system that performs the process 300. An input signal (e.g., a voltage signal) is received 304 in an input device. For example, the input signal 202a-b can received in the input device 204a-b. The input signal is converted 306 to a current signal. For example, the input device 204a-b can convert the current signal 202a-b. The current signal is received 308 in a driver stage, the driver stage having at least two drivers. For example, the driver stage 206 has two drivers 208a-b. An output signal is received 310 from the driver stage to a latch stage. For example, the output signal from the driver stage 206 is received by the latch stage 210. If the input signal is imbalanced 312, the latch stage provides feedback 314 to the driver stage. For example, the signal from the latch stage 210 is fed back into the driver stage 206. Next, the output signal is amplified 316 from the driver stage in proportion to the imbalance on the driver stage. For example, the latches 212a-b may be a cross-coupled pair to amplify a small imbalance on the driver stage 206 side. If there is no imbalance 312 or the output signal is already amplified 316, the input signal is divided 318 such that the current signal has a frequency of a multiple of the output signal. For example, the amplified signal fed back to the driver stage 206 can be divided into a multiple of the output signal. The divided signal is converted 320 to a voltage signal. For example, resistors can be used to create a voltage signal from the output of the latch stage 210.

The example process 300 can result in higher frequency operation and improved locking range for a given power consumption. The transconductance of a clock driver can also be increased to maximize clock energy injected into a common source node to improve locking range and oscillation frequency. The oscillation frequency may also be increased by reducing the latch stage current. In some implementations, the frequency divider can divide signals with an initial frequency above 10 GHz or above 12 GHz. The IQ matching can also be improved using larger driver devices. Likewise, IQ matching may be improved implementing a degenerated latch stage, which may also retain performance levels of alternating current. Similarly, the latching stage may also be unclocked. Power consumption can also be reduced, in some implementations, power consumption can be reduced from approximately 3 mA to approximately 2.75 mA.

Figure 4B:
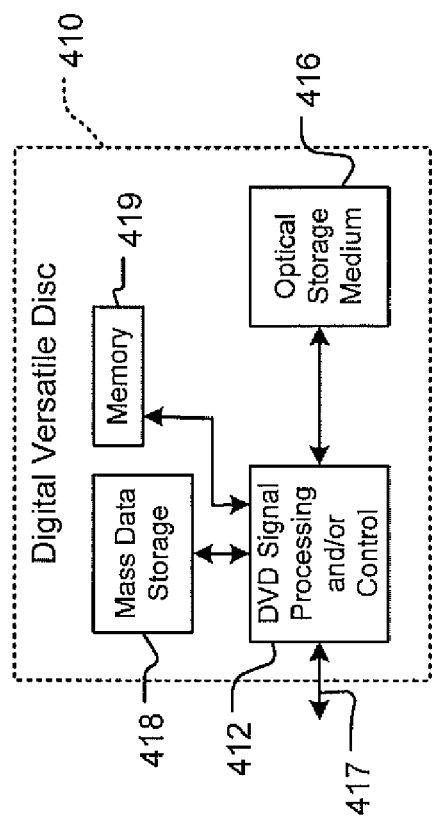
FIGS. 4A-4G show various exemplary implementations of the described systems and techniques.
Figure 4A:
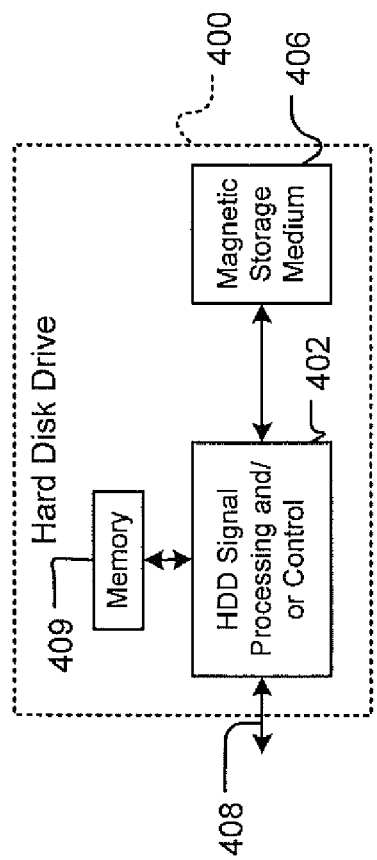

FIGS. 4A-4G show various exemplary implementations of the described systems and techniques. Referring now to FIG. 4A, the described systems and techniques can be implemented in a hard disk drive (HDD) 400. The described systems and techniques may be implemented in either or both signal processing and/or control circuits, which are generally identified in FIG. 4A at 402. In some implementations, the signal processing and/or control circuit 402 and/or other circuits (not shown) in the HDD 400 may process data, perform coding and/or encryption, perform calculations, and/or format data that is output to and/or received from a magnetic storage medium 406.

The HDD 400 may communicate with a host device (not shown) such as a computer, mobile computing devices such as personal digital assistants, cellular phones, media or MP3 players and the like, and/or other devices via one or more wired or wireless communication links 408. The HDD 400 may be connected to memory 409 such as random access memory (RAM), low latency nonvolatile memory such as flash memory, read only memory (ROM) and/or other suitable electronic data storage.

Referring now to FIG. 4B, the described systems and techniques can be implemented in a digital versatile disc (DVD) drive 410. The described systems and techniques may be implemented in either or both signal processing and/or control circuits, which are generally identified in FIG. 4B at 412, and/or mass data storage of the DVD drive 410. The signal processing and/or control circuit 412 and/or other circuits (not shown) in the DVD drive 410 may process data, perform coding and/or encryption, perform calculations, and/or format data that is read from and/or data written to an optical storage medium 416. In some implementations, the signal processing and/or control circuit 412 and/or other circuits (not shown) in the DVD drive 410 can also perform other functions such as encoding and/or decoding and/or any other signal processing functions associated with a DVD drive.

The DVD drive 410 may communicate with an output device (not shown) such as a computer, television or other device via one or more wired or wireless communication links 417. The DVD drive 410 may communicate with mass data storage 418 that stores data in a nonvolatile manner. The mass data storage 418 may include a hard disk drive (HDD). The HDD may have the configuration shown in FIG. 4A. The HDD may be a mini HDD that includes one or more platters having a diameter that is smaller than approximately 1.8". The DVD drive 410 may be connected to memory 419 such as RAM, ROM, low latency nonvolatile memory such as flash memory and/or other suitable electronic data storage.

Figures 4C, 4D:
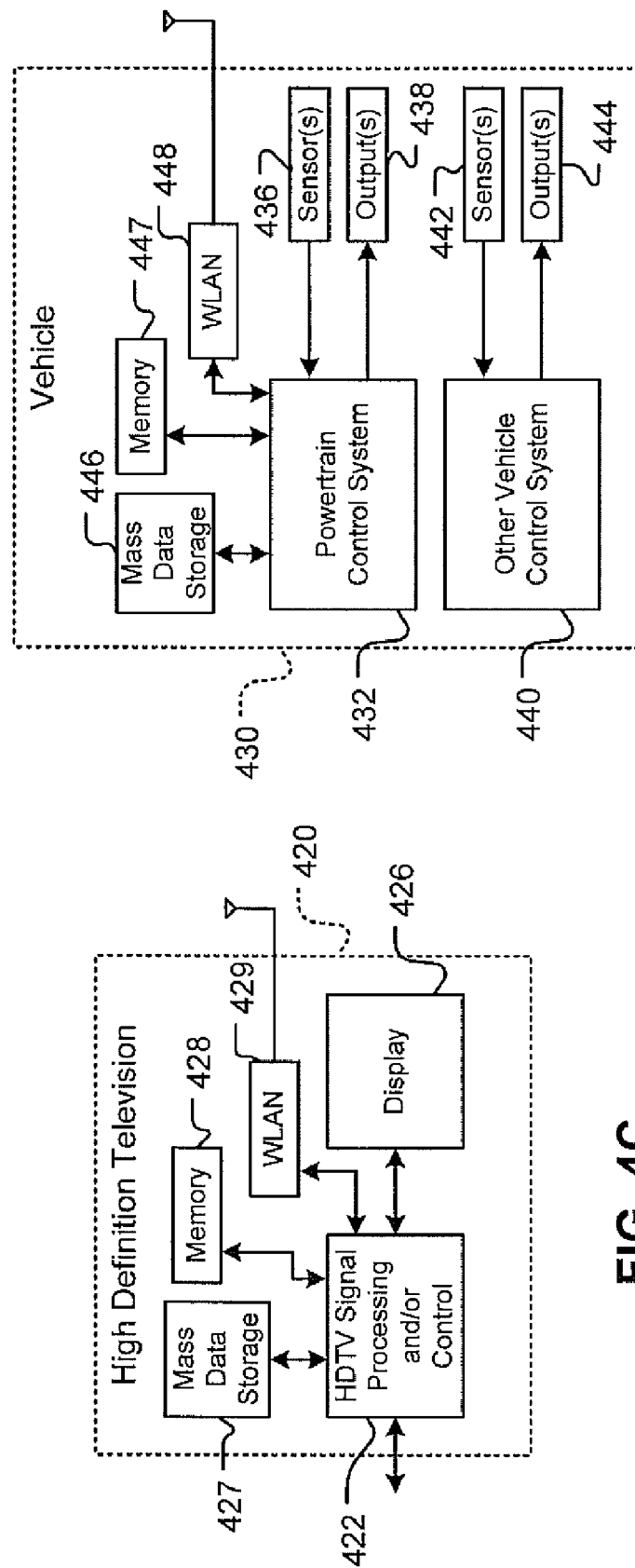

Referring now to FIG. 4C, the described systems and techniques can be implemented in a high definition television (HDTV) 420. The described systems and techniques may be implemented in either or both signal processing and/or control circuits, which are generally identified in FIG. 4C at 422, a WLAN interface and/or mass data storage of the HDTV 420. The HDTV 420 receives HDTV input signals in either a wired or wireless format and generates HDTV output signals for a display 426. In some implementations, signal processing circuit and/or control circuit 422 and/or other circuits (not shown) of the HDTV 420 may process data, perform coding and/or encryption, perform calculations, format data and/or perform any other type of HDTV processing that may be required.

The HDTV 420 may communicate with mass data storage 427 that stores data in a nonvolatile manner such as optical and/or magnetic storage devices, for example, hard disk drives and/or DVD drives. At least one HDD may have the configuration shown in FIG. 4A and/or at least one DVD drive may have the configuration shown in FIG. 4B. The HDD may be a mini HDD that includes one or more platters having a diameter that is smaller than approximately 1.8". The HDTV 420 may be connected to memory 428 such as RAM, ROM, low latency nonvolatile memory such as flash memory and/or other suitable electronic data storage. The HDTV 420 also may support connections with a WLAN via a WLAN interface 429.

Referring now to FIG. 4D, the described systems and techniques may be implemented in a control system of a vehicle 430, a WLAN interface and/or mass data storage of the vehicle control system. In some implementations, the described systems and techniques may be implemented in a powertrain control system 432 that receives inputs from one or more sensors 436 such as temperature sensors, pressure sensors, rotational sensors, airflow sensors and/or any other suitable sensors and/or that generates one or more output control signals to one or more output devices 438. The one or more output control signals can include engine operating parameters, braking parameters, transmission operating parameters, and/or other control signals.

The described systems and techniques may also be implemented in other control systems 440 of the vehicle 430. The control system 440 may likewise receive signals from input sensors 442 and/or output control signals to one or more output devices 444. In some implementations, the control system 440 may be part of an anti-lock braking system (ABS), a navigation system, a telematics system, a vehicle telematics system, a lane departure system, an adaptive cruise control system, a vehicle entertainment system such as a stereo, DVD drive, compact disc and the like. Still other implementations are contemplated.

The powertrain control system 432 may communicate with mass data storage 446 that stores data in a nonvolatile manner. The mass data storage 446 may include optical and/or magnetic storage devices, for example, hard disk drives and/or DVD drives. At least one HDD may have the configuration shown in FIG. 4A and/or at least one DVD drive may have the configuration shown in FIG. 4B. The HDD may be a mini HDD that includes one or more platters having a diameter that is smaller than approximately 1.8". The powertrain control system 432 may be connected to memory 447 such as RAM, ROM, low latency nonvolatile memory such as flash memory and/or other suitable electronic data storage. The powertrain control system 432 also may support connections with a WLAN via a WLAN interface 448. The control system 440 may also include mass data storage, memory and/or a WLAN interface (all not shown).

Figure 4E:
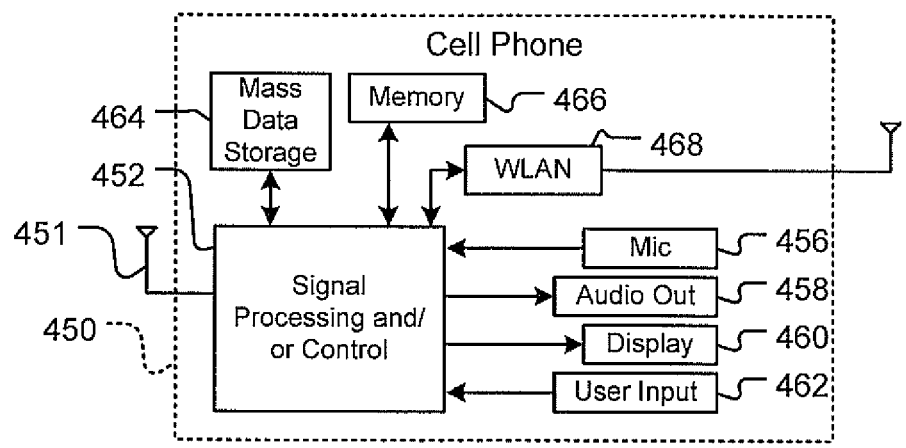

Referring now to FIG. 4E, the described systems and techniques can be implemented in a cellular phone 450 that may include a cellular antenna 451. The described systems and techniques may be implemented in either or both signal processing and/or control circuits, which are generally identified in FIG. 4E at 452, a WLAN interface and/or mass data storage of the cellular phone 450. In some implementations, the cellular phone 450 includes a microphone 456, an audio output 458 such as a speaker and/or audio output jack, a display 460 and/or an input device 462 such as a keypad, pointing device, voice actuation and/or other input device. The signal processing and/or control circuits 452 and/or other circuits (not shown) in the cellular phone 450 may process data, perform coding and/or encryption, perform calculations, format data and/or perform other cellular phone functions.

The cellular phone 450 may communicate with mass data storage 464 that stores data in a nonvolatile manner such as optical and/or magnetic storage devices, for example, hard disk drives and/or DVD drives. At least one HDD may have the configuration shown in FIG. 4A and/or at least one DVD drive may have the configuration shown in FIG. 4B. The HDD may be a mini HDD that includes one or more platters having a diameter that is smaller than approximately 1.8". The cellular phone 450 may be connected to memory 466 such as RAM, ROM, low latency nonvolatile memory such as flash memory and/or other suitable electronic data storage. The cellular phone 450 also may support connections with a WLAN via a WLAN interface 468.

Figure 4F:
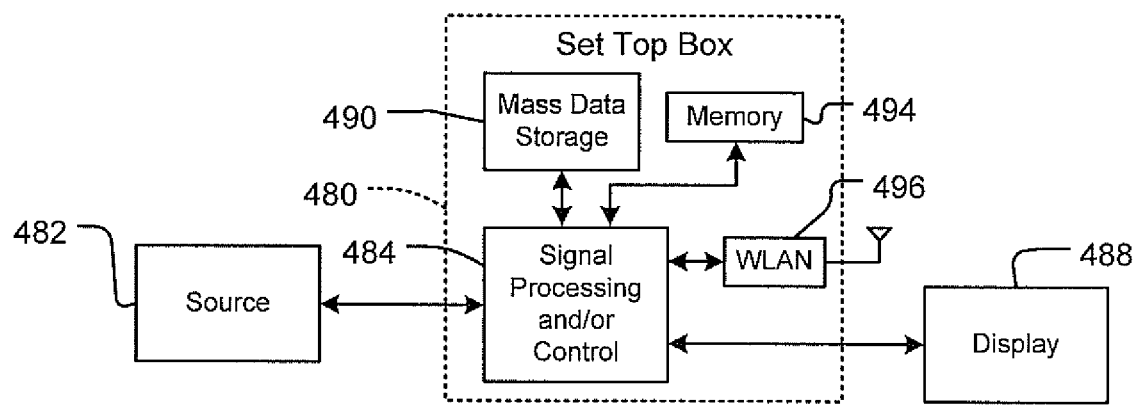

Referring now to FIG. 4F, the described systems and techniques can be implemented in a set top box 480. The described systems and techniques may be implemented in either or both signal processing and/or control circuits, which are generally identified in FIG. 4F at 484, a WLAN interface and/or mass data storage of the set top box 480. The set top box 480 receives signals from a source 482 such as a broadband source and outputs standard and/or high definition audio/video signals suitable for a display 488 such as a television and/or monitor and/or other video and/or audio output devices. The signal processing and/or control circuits 484 and/or other circuits (not shown) of the set top box 480 may process data, perform coding and/or encryption, perform calculations, format data and/or perform any other set top box function.

The set top box 480 may communicate with mass data storage 490 that stores data in a nonvolatile manner. The mass data storage 490 may include optical and/or magnetic storage devices, for example, hard disk drives and/or DVD drives. At least one HDD may have the configuration shown in FIG. 4A and/or at least one DVD drive may have the configuration shown in FIG. 4B. The HDD may be a mini HDD that includes one or more platters having a diameter that is smaller than approximately 1.8". The set top box 480 may be connected to memory 494 such as RAM, ROM, low latency nonvolatile memory such as flash memory and/or other suitable electronic data storage. The set top box 480 also may support connections with a WLAN via a WLAN interface 496.

Figure 4G:
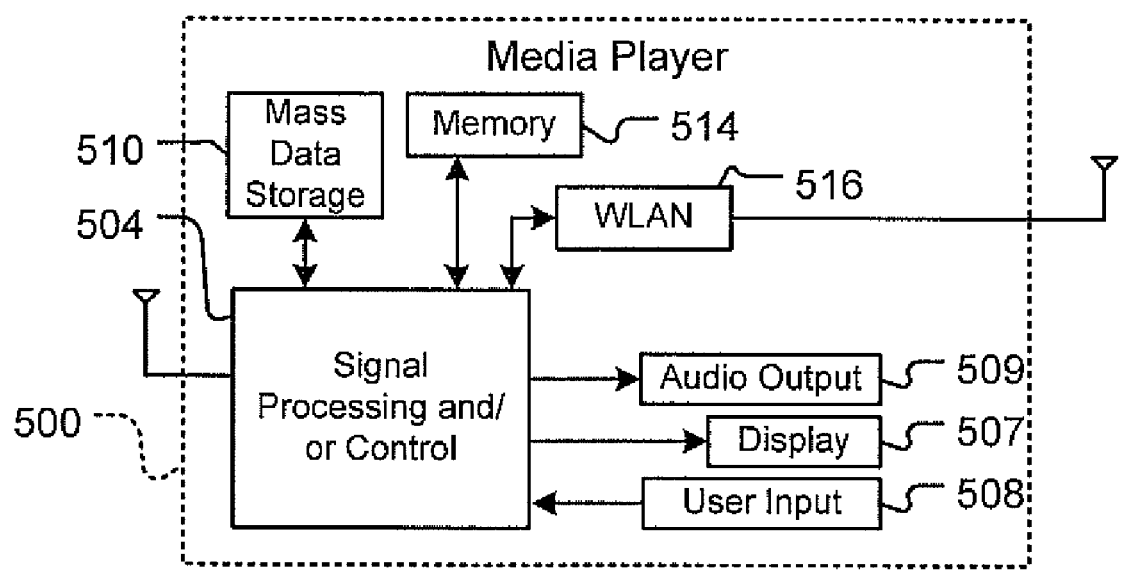

Referring now to FIG. 4G, the described systems and techniques can be implemented in a media player 500. The described systems and techniques may be implemented in either or both signal processing and/or control circuits, which are generally identified in FIG. 4G at 504, a WLAN interface and/or mass data storage of the media player 500. In some implementations, the media player 500 includes a display 507 and/or a user input 508 such as a keypad, touchpad and the like. In some implementations, the media player 500 may employ a graphical user interface (GUI) that typically employs menus, drop down menus, icons and/or a point-and-click interface via the display 507 and/or user input 508. The media player 500 further includes an audio output 509 such as a speaker and/or audio output jack. The signal processing and/or control circuits 504 and/or other circuits (not shown) of the media player 500 may process data, perform coding and/or encryption, perform calculations, format data and/or perform any other media player function.

The media player 500 may communicate with mass data storage 510 that stores data such as compressed audio and/or video content in a nonvolatile manner. In some implementations, the compressed audio files include files that are compliant with MP3 (Moving Picture experts group audio layer 3) format or other suitable compressed audio and/or video formats. The mass data storage may include optical and/or magnetic storage devices, for example, hard disk drives and/or DVD drives. At least one HDD may have the configuration shown in FIG. 4A and/or at least one DVD drive may have the configuration shown in FIG. 4B. The HDD may be a mini HDD that includes one or more platters having a diameter that is smaller than approximately 1.8". The media player 500 may be connected to memory 514 such as RAM, ROM, low latency nonvolatile memory such as flash memory and/or other suitable electronic data storage. The media player 500 also may support connections with a WLAN via a WLAN interface 516. Still other implementations in addition to those described above are contemplated.

A few embodiments have been described in detail above, and various modifications are possible. The disclosed subject matter, including the functional operations described in this specification, can be implemented in electronic circuitry, computer hardware, firmware, software, or in combinations of them, such as the structural means disclosed in this specification and structural equivalents thereof, including potentially a program operable to cause one or more data processing apparatus to perform the operations described (such as a program encoded in a computer-readable medium, which can be a memory device, a storage device, a machine-readable storage substrate, or other physical, machine-readable medium, or a combination of one or more of them).

The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them.

A program (also known as a computer program, software, software application, script, or code) can be written in any form of programming language, including compiled or interpreted languages, or declarative or procedural languages, and it can be deployed in any form, including as a stand alone program or as a module, component, subroutine, or other unit suitable for use in a computing environment. A program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A program can be deployed to be executed on one computer or on multiple computers that are located at one site or distributed across multiple sites and interconnected by a communication network.

While this specification contains many specifics, these should not be construed as limitations on the scope of what may be claimed, but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments.

Other embodiments fall within the scope of the following claims.

What is claimed is:

1. A frequency divider comprising:
    an input device configured to receive a differential input signal having a frequency of at least 10 GHz, the input device further configured to convert the differential input signal to a current signal;
    a driver stage with at least two drivers, the at least two drivers configured to receive the current signal from the input device;
    a latch stage with at least two latches configured to receive output signals from the driver stage, the latch stage being further configured to amplify the output signals from the driver stage in proportion to an imbalance on the driver stage;
    a feedback loop to feed back latch stage output signals to the driver stage;
    the driver stage and the latch stage configured to divide the differential input signal such that the current signal has a frequency of a multiple of the divided signal; and
    an output device configured to convert the divided signal to a divided voltage signal.

2. The frequency divider of claim 1, wherein current of the latch stage output signal is reduced in comparison to the current signal received by the at least two drivers.

3. The frequency divider of claim 2, wherein a ratio between the current signal and the latch stage output signals is 3:1.

4. The frequency divider of claim 2, further comprising:
    one or more input driving transistors, and
    two or more parasitic capacitors,
    wherein the output device comprises at least one resistor.

5. The frequency divider of claim 2, wherein a clock signal triggers the at least two drivers to produce the output signals of the driver stage.

6. The frequency divider of claim 2, wherein the latch stage (i) remains on during a clock cycle of the driver stage, and (ii) is un-clocked and degenerated.

7. The frequency divider of claim 2, wherein the at least two latches are cross-coupled latches.

8. A method for dividing a frequency signal comprising:
    converting a differential input signal having a frequency of at least 10 GHz to a current signal;
    transmitting the current signal at least twice in parallel, producing a driven signal, wherein a clock signal triggers said producing the driven signal;
    latching the driven signal at least twice in parallel, including amplifying the driven signal in proportion to an imbalance associated with transmitting the driven signal;
    feeding back an output from the latched driven signal into the parallel transmissions of the current signal;
    receiving a divided driven signal from the latching at least twice in parallel, the divided driven signal having a frequency being a fraction of the driven signal; and
    converting the divided driven signal to a divided voltage signal.

9. The method of claim 8, wherein current of the transmitted driven signal is reduced.

10. The method of claim 9, wherein the latching is degenerated.

11. The method of claim 9, wherein the latching is un-clocked.

12. The method of claim 9, wherein the transmitted driven signal and the latched driven signal are biased separately.

13. The method of claim 9, further comprising increasing conductance of the clock signal to maximize clock energy fed into a common-source node.

14. A system comprising:
- a communications medium access device; and
- one or more integrated circuits including a frequency divider comprising:
  - an input device configured to receive a differential input signal having a frequency of at least 10 GHz, the input device configured to convert the differential input signal to a current signal;
  - a driver stage with at least two drivers, the at least two drivers configured to receive the current signal from the input device;
  - a latch stage with at least two latches configured to receive output signals from the driver stage, the latch stage configured to amplify the output signals from the driver stage in proportion to an imbalance on the driver stage;
  - a feedback loop feeding back latch stage output signals to the driver stage;
  - the driver stage and the latch stage configured to divide the differential input signal such that the current signal has a frequency of a multiple of the divided signal; and
  - an output device configured to convert the divided signal to a divided voltage signal.

15. The system of claim 14, wherein the driver stage and the latch stage are further configured such that current of the latch stage output signal is reduced in comparison to the current signal received by the at least two drivers.

16. The system of claim 15, wherein a ratio between the current signals and the latch stage output signals is 3:1.

17. The system of claim 15, wherein the frequency divider further comprises:
- one or more input driving transistors, and
- two or more parasitic capacitors,
- wherein the output device comprises at least one resistor.

18. The system of claim 15, wherein a clock signal triggers the at least two drivers to produce the output signals of the driver stage.

19. The system of claim 15, wherein the latch stage (i) remains on during a clock cycle of the driver stage, and (ii) is un-clocked and degenerated.

20. The system of claim 15, wherein the at least two latches are cross-coupled latches.

* * * * *